United States Patent
Sugimoto et al.

(10) Patent No.: US 10,418,074 B2
(45) Date of Patent: Sep. 17, 2019

(54) SEMICONDUCTOR MEMORY DEVICE

(71) Applicant: TOSHIBA MEMORY CORPORATION, Tokyo (JP)

(72) Inventors: Takeshi Sugimoto, Yokohama Kanagawa (JP); Takayuki Miyazaki, Tokyo (JP); Yuki Inuzuka, Kawasaki Kanagawa (JP)

(73) Assignee: TOSHIBA MEMORY CORPORTION, Tokyo (JP)

( * ) Notice: Subject to any disclaimer, the term of this patent is extended or adjusted under 35 U.S.C. 154(b) by 0 days.

(21) Appl. No.: 15/906,592

(22) Filed: Feb. 27, 2018

(65) Prior Publication Data
US 2019/0066737 A1 Feb. 28, 2019

(30) Foreign Application Priority Data
Aug. 29, 2017 (JP) .................. 2017-164763

(51) Int. Cl.
| | |
|---|---|
| G11C 7/00 | (2006.01) |
| G11C 5/14 | (2006.01) |
| G11C 8/08 | (2006.01) |
| G11C 8/10 | (2006.01) |
| G11C 5/06 | (2006.01) |
| G11C 7/02 | (2006.01) |
| G11C 7/12 | (2006.01) |
| G11C 16/30 | (2006.01) |
| G11C 8/14 | (2006.01) |

(52) U.S. Cl.
CPC .............. *G11C 5/147* (2013.01); *G11C 5/063* (2013.01); *G11C 7/02* (2013.01); *G11C 8/08* (2013.01); *G11C 8/10* (2013.01); *G11C 7/12* (2013.01); *G11C 8/14* (2013.01); *G11C 16/30* (2013.01)

(58) Field of Classification Search
CPC ....................................... G11C 16/30
USPC ......................................... 365/226
See application file for complete search history.

(56) References Cited

U.S. PATENT DOCUMENTS

| | | | |
|---|---|---|---|
| 7,050,345 B1 | 5/2006 | Sheppard | |
| 2004/0114439 A1 | 6/2004 | Gogl et al. | |
| 2010/0290301 A1 | 11/2010 | Scheuerlein | |
| 2014/0104923 A1* | 4/2014 | Baek ................. | G11C 13/0069 365/148 |

(Continued)

FOREIGN PATENT DOCUMENTS

JP 6107472 B2 4/2017

*Primary Examiner* — Hoai V Ho
(74) *Attorney, Agent, or Firm* — Kim & Stewart LLP

(57) ABSTRACT

A semiconductor memory device includes a memory cell array with bit lines and word lines connected thereto. A first power supply circuit generates a selected bit line voltage. A second power supply circuit generates a non-selected bit line voltage. A third power supply circuit generates a selected word line voltage. A fourth power supply circuit generates a non-selected word line voltage. A first decoder connects the selected bit line to the first power supply circuit and connects the non-selected bit line to the second power supply circuit. A second decoder connects the selected word line to the third power supply circuit and connects the non-selected word line to the fourth power supply circuit. A capacitive element is between a first node that is between the second power supply circuit and the first decoder and a second node that is between the third power supply circuit and the second decoder.

20 Claims, 7 Drawing Sheets

(56) References Cited

U.S. PATENT DOCUMENTS

2016/0141039 A1 5/2016 Arakawa

* cited by examiner

SEMICONDUCTOR MEMORY DEVICE

CROSS-REFERENCE TO RELATED APPLICATION

This application is based upon and claims the benefit of priority from Japanese Patent Application No. 2017-164763, filed Aug. 29, 2017, the entire contents of which are incorporated herein by reference.

FIELD

Embodiments described herein relate generally to a semiconductor memory device.

BACKGROUND

Recently, the interval between adjacent bit lines and the interval between adjacent word lines has been significantly narrowed with efforts to miniaturize semiconductor memory devices. As the interval between the bit lines or between the word lines is reduced, a parasitic capacitance between adjacent lines increases. When the parasitic capacitance between the bit lines increases, there is a possibility that noise that enters one bit line will cause noise on an adjacent bit line.

DETAILED DESCRIPTION

In general, according to one embodiment, a semiconductor memory device comprises a memory cell array, a plurality of bit lines connected to the memory cell array, and a plurality of word lines connected to the memory cell array. A first power supply circuit generates a selected bit line voltage that is applied to a selected bit line among the plurality of bit lines. A second power supply circuit generates a non-selected bit line voltage that is applied to non-selected bit lines among the plurality of bit lines. A third power supply circuit generates a selected word line voltage that is applied to a selected word line from among the plurality of word lines. A fourth power supply circuit generates a non-selected word line voltage that is applied to non-selected word lines from among the plurality of word lines. A first decoder connects the selected bit line to the first power supply circuit and connects the non-selected bit line to the second power supply circuit. A second decoder connects the selected word line to the third power supply circuit and connects the non-selected word line to the fourth power supply circuit. A capacitive element is formed or connected between a first node that is between the second power supply circuit and the first decoder and a second node that is between the third power supply circuit and the second decoder.

Hereinafter, various examples embodiments of the present disclosure will be described with reference to the drawings. The example embodiments do not limit the scope of the present disclosure.

First Embodiment

Figure 1:
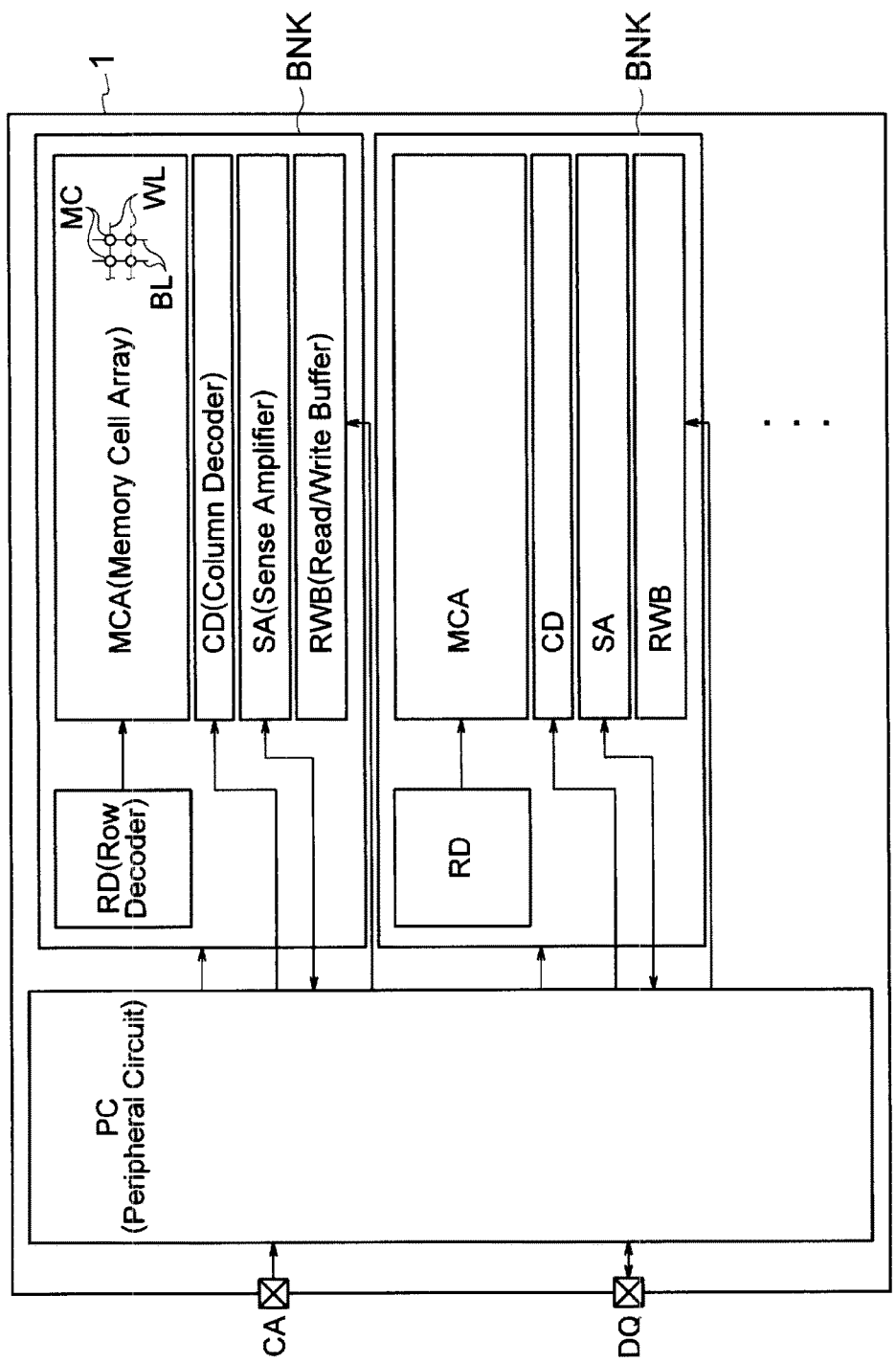
FIG. 1 is a block diagram illustrating aspects of a semiconductor memory device according to a first embodiment.

FIG. 1 is a block diagram illustrating a semiconductor memory device according to a first embodiment. The semiconductor memory device 1 may be, for example, a volatile memory, such as a dynamic random access memory (DRAM), or a nonvolatile memory, such as a NAND-type electrically erasable and programmable read-only-memory (EEPROM), a resistive RAM (ReRAM), or a magnetoresistive RAM (MRAM). In addition, the semiconductor memory device 1 may be, for example, a single memory chip or a packaged module, such as a dual inline memory module (DIMM), including a plurality of memory chips.

The example semiconductor memory device 1 illustrated in FIG. 1 is a single memory chip. The semiconductor memory device 1 is hereinafter referred to as a memory chip 1. The memory chip 1 includes a memory cell array MCA, a column decoder CD, a row decoder RD, a sense amplifier SA, a read/write buffer RWB, and a peripheral circuit PC.

The memory cell array MCA includes, for example, a plurality of memory cells MC two-dimensionally arranged in a matrix. The memory cell MC is, for example, a resistance change type memory such as a ReRAM. Each memory cell MC is disposed at an intersection between a bit line BL and a word line WL. That is, the memory cell array MCA is a so-called cross-point type memory cell array. When the bit line BL is substantially orthogonal to the word line WL. The bit lines BL are connected to one end of each memory cell MC of the memory cell array MCA. The word lines WL are connected to gate terminals or the like of the memory cells MC. The memory cell array MCA is divided into a plurality of banks BNK and a sense amplifier SA, a data latch DL, an address latch AL, and the like are provided with each bank BNK.

The sense amplifier SA is connected to the memory cell MC via the bit line BL, and applies a write voltage and a read voltage to the memory cell MC via the bit line BL. The sense amplifier SA writes data to the memory cell MC by applying the write voltage to the memory cell MC, or reads data from the memory cell MC by applying the read voltage to the memory cell MC.

The read/write buffer RWB temporarily holds data detected by the sense amplifier SA for each page, or temporarily holds data to be written to the memory cell array MCA for each page. The read/write buffer RWB may also hold address information for read/write targets.

The row decoder RD and the column decoder CD access the memory cell array MCA according to a supplied bank address and page address, and apply the write voltage or the read voltage to the word line WL and the bit line BL. The row decoder RD applies the write voltage or the read voltage to a selected word line selected from among the plurality of word lines WL. The column decoder CD connects a selected bit line selected from among the plurality of bit lines BL to the sense amplifier SA. The sense amplifier SA applies the write voltage or the read voltage to the selected bit line. Thereby, the memory chip 1 can write data to a desired memory cell MC in the memory cell array MCA or read data from a desired memory cell MC.

Figure 2:
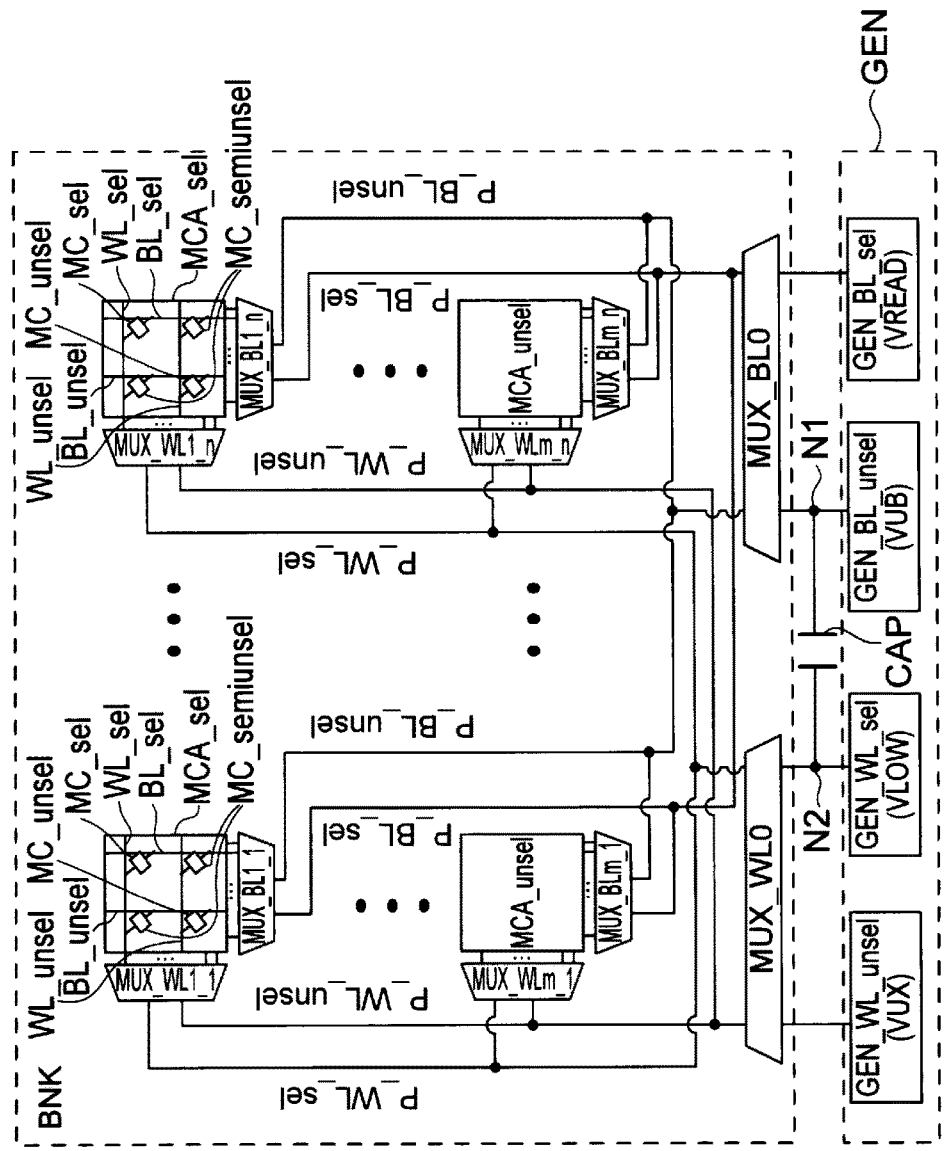
FIG. 2 is a block diagram illustrating aspects of a bank, a column decoder, and a row decoder.

The peripheral circuit PC includes therein, for example, a voltage generation circuit, a read/write engine, an address controller, a command controller, an input/output circuit, and the like. The voltage generation circuit GEN generates a voltage of the word line WL or a voltage of the bit line BL as necessary for a data read operation and a data write operation. A more detailed configuration of the voltage generation circuit GEN is illustrated in FIG. 2. The read/write engine controls the column decoder CD and the row decoder RD so as to write data to a desired memory cell MC in the bank BNK according to a command and an address, or so as to read data from a desired memory cell MC in the bank BNK. The read/write engine transmits the read data to a DQ buffer of the input/output circuit. The address controller receives a row address, a column address, and the like, and decodes the addresses. The command controller receives commands instructing various operations such as a data read operation or a data write operation, and transmits these commands to the read/write engine. The input/output (IO) circuit takes commands and addresses from the command and address (CA) terminal CA, transmits the commands to the command controller, and transmits the addresses to the address controller. The command may be a write command instructing a write operation or a read command instructing a read operation. The address may be a bank address indicating any bank BNK of the memory cell array MCA and an address indicating a particular page to be read or written in the bank BNK or a particular memory cell MC. In addition, the input/output circuit takes in write data from the DQ terminal and transmits the write data to the read/write buffer RWB. Alternatively, the input/output circuit receives the read data held in the data latch DL and outputs the read data from the DQ terminal.

A memory controller for controlling the all memory chips 1 may be provided outside the memory chips 1.

FIG. 2 is a block diagram illustrating a more detailed configuration example of the bank BNK, the column decoder CD, and the row decoder RD. The bank BNK is a sub-portion of the memory cell array MCA, and further includes a plurality of memory cell arrays subdivided corresponding to multiplexers MUX_BL1_1 to MUX_BLm_n and MUX_WL1_1 to MUX_WLm_n. Hereinafter, these subdivided memory cell arrays are referred for simplicity in the collective as the memory cell array MCA.

The memory chip 1 includes the memory cell array MCA, the multiplexers MUX_BL1_1 to MUX_BLm_n and MUX_BL0 as the column decoders CD, the multiplexers MUX_WL1_1 to MUX_WLm_n and MUX_WL0 as the row decoders RD, bit line paths P_BL_sel and P_BL_unsel, word line paths P_WL_sel and P_WL_unsel, a selected BL voltage generation circuit GEN_BL_sel, a non-selected BL voltage generation circuit GEN_BL_unsel, a selected WL voltage generation circuit GEN_WL_sel, a non-selected WL voltage generation circuit GEN_W_unsel, and a capacitive element CAP.

The column decoders CD include the multiplexers MUX_BL1_1 to MUX_BLm_n and MUX_BL0. The multiplexers MUX_BL1_1 to MUX_BLm_n are respectively provided corresponding to the memory cell arrays MCA and are connected to the plurality of bit lines BL of each memory cell array MCA. Meanwhile, each of m and n is an integer of 1 or more. Each of the multiplexers MUX_BL1_1 to MUX_BLm_n connects one selected bit line BL_sel selected from among the bit lines BL of a corresponding memory cell array MCA to the selected bit line path P_BL_sel and apply a selected bit line voltage VREAD to the selected bit line. The multiplexers MUX_BL1_1 to MUX_BLm_n connect the non-selected bit lines BL_unsel other than the selected bit lines BL_sel to the non-selected bit line paths P_BL_unsel and apply the non-selected bit line voltage VUB to the non-selected bit lines. Alternatively, the multiplexers MUX_BL1_1 to MUX_BLm_n place the non-selected bit line BL_unsel in a floating state and do not apply a voltage. While not illustrated, for example, the multiplexers MUX_BL1_1 to MUX_BLm_n are configured with switching elements, such as metal oxide semiconductor field effect transistors (MOSFETs).

The multiplexer MUX_BL0 is connected between the selected BL voltage generation circuit GEN_BL_sel and the plurality of bit line paths and between the non-selected BL voltage generation circuit GEN_BL_unsel and the plurality of bit line paths. The multiplexer MUX_BL0 connects one bit line path selected from among the plurality of bit line paths to the selected BL voltage generation circuit GEN_BL_sel as the selected bit line path P_BL_sel. Meanwhile, the multiplexer MUX_BL0 connects the non-selected bit line paths among the plurality of bit line paths to the non-selected BL voltage generation circuit GEN_BL_unsel as P_BL_unsel.

The bit line paths P_BL_sel and P_BL_unsel are wiring paths between the multiplexers MUX_BL1_1 to MUX_BLm_n and the multiplexer MUX_BL0. For example, 32 or 64 bit line paths are provided. As described above, the multiplexer MUX_BL0 selects one of the bit line paths and connects this selected bit line path P_BL_sel to the selected BL voltage generation circuit GEN_BL_sel. The selected bit line path P_BL_sel transmits the selected bit line voltage VREAD. Meanwhile, the multiplexer MUX_BL0 connects the non-selected bit line paths P_BL_unsel among bit line paths to the non-selected BL voltage generation circuit GEN_BL_unsel. The non-selected bit line paths P_BL_unsel transmit the non-selected bit line voltage VUB.

The selected BL voltage generation circuit GEN_BL_sel as a first power supply circuit generates the selected bit line voltage VREAD applied to the selected bit lines BL_sel from an external power supply. The selected bit line voltage VREAD is a high level voltage, for example, several volts. The selected bit line path P_BL_sel transmits the selected bit line voltage VREAD from the multiplexer MUX_BL0 to the multiplexers MUX_BL1_1 to MUX_BLm_n. The multiplexers MUX_BL1_1 to MUX_BLm_n and MUX_BL0 as the first decoder electrically connect the selected bit lines BL_sel from among the plurality of bit lines BL to the selected BL voltage generation circuit GEN_BL_sel via the selected bit line path P_BL_sel, and selectively apply the selected bit line voltage VREAD to the selected bit lines BL_sel.

The non-selected BL voltage generation circuit GEN_BL_unsel as a second power supply circuit generates the non-selected bit line voltage VUB applied to the non-selected bit lines BL_unsel from an external power supply. The non-selected bit line voltage VUB is a voltage that is between the selected bit line voltage VREAD and the selected word line voltage VLOW, and is, for example, VREAD/2 (one half of VREAD). The non-selected bit line paths P_BL_unsel transmit the non-selected bit line voltage VUB from the multiplexer MUX_BL0 to the multiplexers MUX_BL1_1 to MUX_BLm_n. The multiplexers MUX_BL0 and MUX_BL1_1 to MUX_BLm_n as the first decoder electrically connect the non-selected bit lines BL_unsel to the non-selected BL voltage generation circuit GEN_BL_unsel via the non-selected bit line paths P_BL_unsel, and selectively apply the non-selected bit line voltage VUB to the non-selected bit lines BL_unsel. Alternatively, the multiplexers MUX_BL0 and MUX_BL1_1 to MUX_BLm_n do not apply any voltage to the non-selected bit lines BL_unsel.

The row decoder RD as a second decoder includes the multiplexers MUX_WL1_1 to MUX_WL m_n and MUX_WL0. The multiplexers MUX_WL1_1 to MUX_WLm_n are respectively provided corresponding to the memory cell arrays MCA and are connected to a plurality of word lines WL of each memory cell array MCA. The multiplexers MUX_WL1_1 to MUX_WLm_n connect one selected word line WL_sel selected from among the word lines WL of a corresponding memory cell array MCA to the word line path P_WL_sel and apply the selected word line voltage VLOW to the selected word line. The multiplexers MUX_WL1_1 to MUX_WLm_n connect the non-selected word lines WL_unsel other than the selected word line WL_sel to the non-selected word line paths P_WL_unsel and apply the non-selected word line voltage VUX to the non-selected word lines. The multiplexers MUX_WL1_1 to MUX_WLm_n comprise switching elements such as MOSFETs, for example.

The multiplexer MUX_WL0 is connected between the selected WL voltage generation circuit GEN_WL_sel and a plurality of word line paths and between the non-selected WL voltage generation circuit GEN_WL_unsel and the plurality of word line paths. The multiplexer MUX_WL0 connects one selected word line path to the selected WL voltage generation circuit GEN_WL_sel as P_WL_sel. The multiplexer MUX_WL0 connects the non-selected word line paths to the non-selected WL voltage generation circuit GEN_WL_unsel as P_WL_unsel.

The word line paths P_WL_sel and P_WL_unsel are wiring paths connected between the multiplexers MUX_WL1_1 to MUX_WLm_n and the multiplexer MUX_WL0. For example, 32 or 64 word line paths are provided. As described above, the multiplexer MUX_WL0 selects one of the word line paths and connects this selected word line path P_WL_sel to the selected WL voltage generation circuit GEN_WL_sel. The selected word line path P_WL_sel thus transmits the selected word line voltage VLOW. The multiplexer MUX_WL0 connects the non-selected word line paths P_WL_unsel to the non-selected WL voltage generation circuit GEN_WL_unsel. The non-selected word line paths P_WL_unsel thus transmit the non-selected word line voltage VUX.

The selected WL voltage generation circuit GEN_WL_sel as a third power supply circuit generates the selected word line voltage VLOW from an external power supply. The selected word line voltage VLOW is a low level voltage, for example, a ground voltage (0 V). The selected word line path P_WL_sel transmits the selected word line voltage VLOW from the multiplexer MUX_WL0 to the multiplexers MUX_WL1_1 to MUX_WLm_n. The multiplexers MUX_WL1_1 to MUX_WLm_n and MUX_WL0 as a second decoder electrically connect the selected word line WL_sel, selected from among the plurality of word lines WL, to the selected WL voltage generation circuit GEN_WL_sel via the selected word line paths P_WL_sel, and selectively applies the selected word line voltage VLOW to the selected word line WL_sel.

The non-selected WL voltage generation circuit GEN_WL_unsel as a fourth power supply circuit generates the non-selected word line voltage VUX from an external power supply. The non-selected word line voltage VUX is a voltage between the selected bit line voltage VREAD and the selected word line voltage VLOW, and is, for example, VREAD/2 (one half VREAD). It is preferable that the non-selected word line voltage VUX be approximately equal to the non-selected bit line voltage VUB. However, the non-selected word line voltage VUX may be different from the non-selected bit line voltage VUB. The non-selected word line paths P_WL_unsel transmit the non-selected word line voltage VUX from the multiplexer MUX_WL0 to the multiplexers MUX_WL1_1 to MUX_WLm_n. The multiplexers MUX_WL1_1 to MUX_WLm_n as the second decoder electrically connect the non-selected word lines WL_unsel to the non-selected WL voltage generation circuit GEN_WL_unsel via the non-selected word line paths P_WL_unsel and selectively apply the non-selected word line voltage VUX to the non-selected word lines WL_unsel.

As such, a voltage difference between the selected bit line voltage VREAD and the selected word line voltage VLOW is applied to a selected memory cell MC_sel that is connected to the selected bit line BL_sel and the selected word line WL_sel. Thereby, data is read from the selected memory cell MC_sel or data is written to the selected memory cell MC_sel. Meanwhile, in the present embodiment, the description will be focused on a data read operation. The selected bit line voltage VREAD applied to the selected bit line BL_sel is a voltage for reading data.

A capacitive element CAP is connected between a first node N1 and a second node N2. The first node N1 is on a connection wire between the non-selected BL voltage generation circuit GEN_BL_unsel and the multiplexer MUX_BL0, and may be at any location along the connection wire. The second node N2 is on a connection wire between the selected WL voltage generation circuit GEN_WL_sel and the multiplexer MUX_WL0, and may be at any location along the connection wire. The capacitive element CAP may be disposed within the decoders CD and RD (see FIG. 1) or may be disposed within the peripheral circuit PC.

The capacitive element CAP may be, for example, a MOS capacitor, a polysilicon capacitor, or a metal capacitor. Furthermore, the capacitive element CAP may be provided by means of the intentional inclusion/use of the parasitic capacitance between the non-selected bit line path P_BL_unsel and the selected word line path P_WL_sel by structural design choices.

In addition, capacitance value of the capacitive element CAP is referred to as Ccap, and capacitance of the selected word line WL_sel is referred to as CWL_sel. In addition, capacitance between the selected bit line BL_sel and the non-selected bit line BL_unsel adjacent thereto is referred to as CBL_sel_unsel, and capacitance of the selected bit line BL_sel is referred to as CBL_sel. In this case, a ratio (Ccap/CWL_sel) of the capacitance Ccap to the capacitance CWL_sel is approximately equal to the ratio (CBL_sel_unsel/CBL_sel) of the capacitance CBL_sel_unsel to the capacitance CBL_sel. That is:

$$Ccap/CWL\_sel = CBL\_sel\_unsel/CBL\_sel \quad \text{(Equation 1)}$$

The capacitance Ccap is set so as to satisfy Equation 1. For example, if CBL_sel_unsel/CBL_sel=1/10, the capacitance Ccap is set to be one tenth of CWL_sel. The capacitance Ccap can be optimized or otherwise adjusted by a trimming process, for example, when inspection is performed after the preprocessing step of a semiconductor wafer.

By satisfying Equation 1, when a noise voltage is transmitted to the non-selected bit line BL_unsel, the noise voltage is transmitted as a voltage approximately equal to the voltages of the selected bit line BL_sel and the selected word line WL_sel.

Next, a data read operation of the memory chip 1 according to the present embodiment will be described.

For example, it is assumed that the plurality of memory cell arrays MCA in the uppermost stage of FIG. 2 are the selected memory cell arrays MCA_sel. In the respective selected memory cell arrays MCA_sel, the memory cell MC connected to the selected bit line BL_sel and the selected word line WL_sel becomes the selected memory cell MC_sel.

The multiplexer MUX_BL0 sets one of the plurality of bit line paths as the selected bit line path P_BL_sel and sets the other as the non-selected bit line paths P_BL_unsel. The multiplexer MUX_WL0 sets one of the plurality of word line paths as the selected word line path P_WL_sel and sets the other as the non-selected word line paths P_WL_unsel.

The multiplexers MUX_BL1_1 to MUX_BL1_$n$ selectively connect the selected bit line BL_sel to the selected bit line path P_BL_sel and transmit the selected bit line voltage VREAD to the selected bit line BL_sel. The multiplexers MUX_WL1_1 to MUX_WL1_$n$ selectively connect the selected word line WL_sel to the selected word line path P_WL_sel and transmit the selected word line voltage VLOW to the selected word line WL_sel. Thereby, a voltage difference (for example, several volts) between the selected bit line voltage VREAD and the selected word line voltage VLOW is applied to the selected memory cell MC_sel. At this time, the sense amplifier SA detects logic of the data stored in the selected memory cell MC_sel.

In the selected memory cell array MCA_sel, the memory cell MC connected to the selected bit line BL_sel and the non-selected word line WL_unsel and the memory cell MC connected to the non-selected bit line BL_unsel and the selected word line WL_sel are in a non-selected state, but a voltage difference of some size is still applied thereto, and thereby, the memory cells MC may become semi-selected memory cells MC_semiunsel. The multiplexers MUX_BL1_1 to MUX_BL1_$n$ selectively connect the non-selected bit line BL_unsel to the non-selected bit line path P_BL_unsel and transmit the non-selected bit line voltage VUB to the non-selected bit lines BL_unsel. The multiplexers MUX_WL1_1 to MUX_WL1_$n$ selectively connect the non-selected word lines WL_unsel to the non-selected word line paths P_WL_unsel and transmit the non-selected word line voltage VUX to the non-selected word lines WL_unsel. Thereby, a voltage difference (for example, VREAD/2) between the non-selected bit line voltage VUB and the selected word line voltage VLOW or a voltage difference (for example, VREAD/2) between the selected bit line voltage VREAD and the non-selected word line voltage VUX is applied to the semi-selected memory cell array MCA_semiunsel in the selected memory cell array MCA_sel.

In the selected memory cell array MCA_sel, the memory cell MC connected to the non-selected bit line BL_unsel and the non-selected word line WL_unsel becomes the non-selected memory cell MC_unsel. A voltage difference between the non-selected bit line voltage VUB and the non-selected word line voltage VUX is applied to the non-selected memory cell array MCA_unsel. If the voltage difference between the non-selected bit line voltage VUB and the non-selected word line voltage VUX is approximately 0 V, there is almost no current flowing through the non-selected memory cell MC_unsel, and unnecessary current consumption can be prevented. The voltage difference between the non-selected bit line voltage VUB and the non-selected word line voltage VUX may be generated to some extent. In this case, the voltage difference applied to the semi-selected memory cell MC_semiunsel can be reduced to VRED/2 or less.

The memory cell arrays MCA other than the memory cell arrays in the uppermost stage of FIG. 2 become non-selected memory cell arrays MCA_unsel. In the non-selected memory cell arrays MCA_unsel, all the memory cells MC are in a floating state. The multiplexers MUX_BL2_1 to MUX_BL2_$n$, MUX_BL3_1 to MUX_BL3_$n$, MUX_BL4_1 to MUX_BL4_$n$ . . . MUX_BLm_1 to MUX_BLm_n do not connect all the bit lines BL of the non-selected memory cell arrays MCA_unsel to the bit line paths. The multiplexers MUX_WL2_1 to MUX_WL2_$n$, MUX_WL3_1 to MUX_WL3_$n$, MUX_WL4_1 to MUX_WL4_$n$ . . . MUX_WLm_1 to MUX_WLm_n do not connect all the word lines WL of the non-selected memory cell arrays MCA_unsel to the word line paths. Thereby, the non-selected memory cells MC_unsel are in an electrically floating state. However, when a read operation or a write operation ends, the bit lines BL and the word lines WL in the non-selected memory cell arrays MCA_unsel are all returned to a non-selected state and then enter the floating state. Thus, the bit lines BL and word lines WL in the non-selected memory cell array MCA_unsel are all in a potential state close to VUB or VUX.

By changing addresses which are input to the multiplexers MUX_BL1_1 to MUX_BLm_n and MUX_WL1_1 to MUX_WLm_n, it is possible to select different memory cells MC, different memory cell arrays MCA, and different banks BNK.

Figure 3:
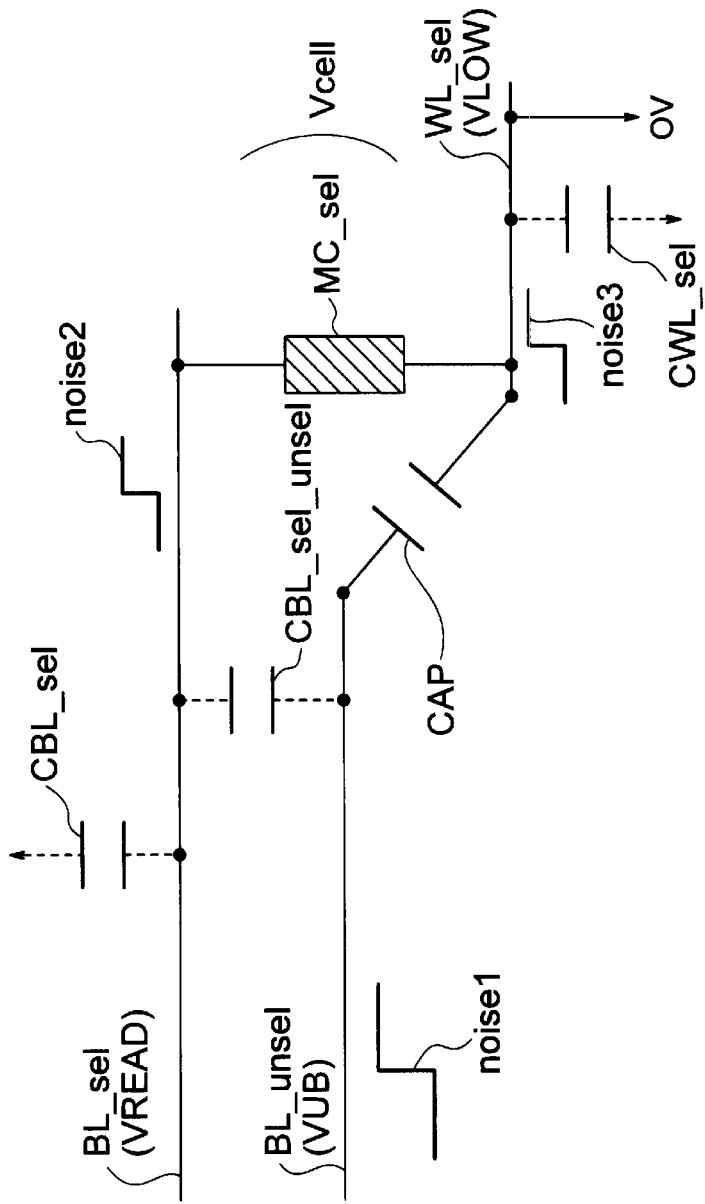
FIG. 3 is an equivalent circuit diagram illustrating a selected memory cell, a capacitive element and a periphery thereof in a data read operation.

FIG. 3 is an equivalent circuit diagram illustrating a selected memory cell, a capacitive element and surrounding thereof in a data read operation.

The selected memory cell MC_sel is connected between the selected bit line BL_sel and the selected word line WL_sel. The selected bit line voltage VREAD is applied to the selected bit line BL_sel as a cell voltage Vcell. The non-selected bit line voltage VUB is applied to the non-selected bit line BL_unsel. The selected word line voltage VLOW is applied to the selected word line WL_sel.

A parasitic capacitance between the selected bit line BL_sel and the non-selected bit line BL_unsel adjacent thereto is CBL_sel_unsel. A total capacitance of the selected bit lines BL_sel is CBL_sel. The capacitance CBL_sel includes wiring capacitances of the selected bit lines BL_sel itself and any parasitic capacitances between the selected bit lines BL_sel and the other adjacent wires (whether explicitly illustrated or not), such as bit line wiring, ground wires, and the like.

A total capacitance of the selected word line WL_sel is CWL_sel. The capacitance CWL_sel includes the wiring capacitances of the selected word lines WL_sel itself and any parasitic capacitances between the selected word lines WL_sel and other adjacent wires (whether explicitly illustrated or not).

The capacitive element CAP is connected between the non-selected bit line BL_unsel and the selected word line WL_sel. The capacitance Ccap of the capacitive element CAP is set so as to satisfy Equation 1 as described above.

Here, it is assumed that noise 1 enters the non-selected bit line BL_unsel. The noise 1 is a voltage generated by, for example, an operation of another bank BNK, an operation of the peripheral circuit PC, or the like. The noise 1 is transmitted from the non-selected bit line BL_unsel to the selected bit line BL_sel via the parasitic capacitance CBL_sel_unsel. If a magnitude of the noise 1 is assumed to be Vnoise 1, the noise 1 is transmitted to the selected bit line BL_sel with a magnitude of approximately (CBL_sel_unsel/CBL_sel)×Vnoise 1. Noise transmitted to the selected bit line BL_sel is referred to as noise 2. A magnitude of the noise 2 is approximately (CBL_sel_unsel/CBL_sel)×Vnoise 1.

However, according to the present embodiment, the capacitive element CAP is connected between the non-selected bit line BL_unsel and the selected word line WL_sel. Accordingly, the noise 1 is also transmitted from the non-selected bit line BL_unsel to the selected word line WL_sel via the capacitive element CAP. At this time, the noise 1 is transmitted to the selected bit line BL_sel with a magnitude of approximately (Ccap/CWL_sel)×Vnoise 1. Noise transmitted to the selected word line WL_sel is referred to here as noise 3. A magnitude of the noise 3 is approximately (Ccap/CWL_sel)×Vnoise 1.

If the capacitive element CAP is set so as to satisfy Equation 1, then a magnitude of the noise 2 (CBL_sel_unsel/CBL_sel)×Vnoise 1 and a magnitude of the noise 3 (Ccap/CWL_sel)×Vnoise 1 will be approximately equal to each other. That is, approximately equal noises will be transmitted to the selected bit line BL_sel and the selected word line WL_sel. In addition, the noise 2 and the noise 3 are generated by the same noise 1 and thus almost simultaneously transmitted to the selected bit line BL_sel and the selected word line WL_sel. Thus, the noise 2 and the noise 3 with an approximately equal magnitude are almost simultaneously applied to the selected bit line BL_sel and the selected word line WL_sel, and thereby, the noise 2 and the noise 3 offset each other in the selected memory cell MC_sel. That is, a voltage difference applied to the selected memory cell MC_sel does not vary with the noise 1.

Figure 4A:
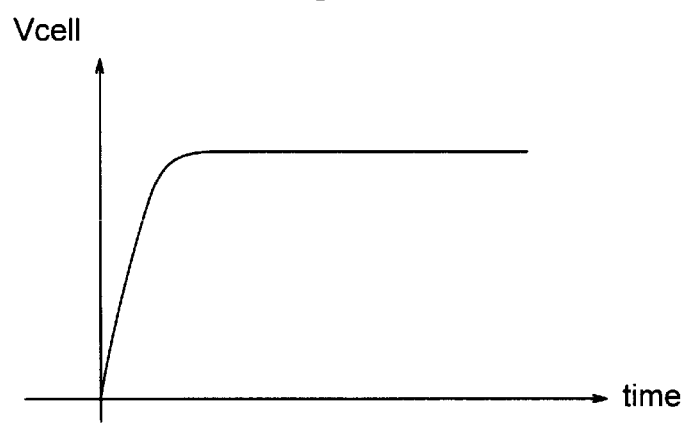
FIGS. 4A and 4B are graphs illustrating a relationship between a cell voltage applied to the selected memory cell and time in the data read operation.

For example, FIG. 4A is a graph illustrating a relationship between the cell voltage Vcell applied to the selected memory cell MC_sel and time in a data read operation of the memory chip 1 according to the present embodiment. As illustrated in FIG. 4A, in the memory chip 1 according to the present embodiment, even if the noise 1 enters the non-selected bit line BL_unset, noise components are rarely contained in the cell voltage Vcell applied to the selected memory cell MC_sel. This is because the noise 2 and noise 3 are almost simultaneously transmitted to the selected bit line BL_sel and the selected word line WL_sel and differences in the voltages applied to the selected memory cell MC_sel are offset.

Figure 4B:
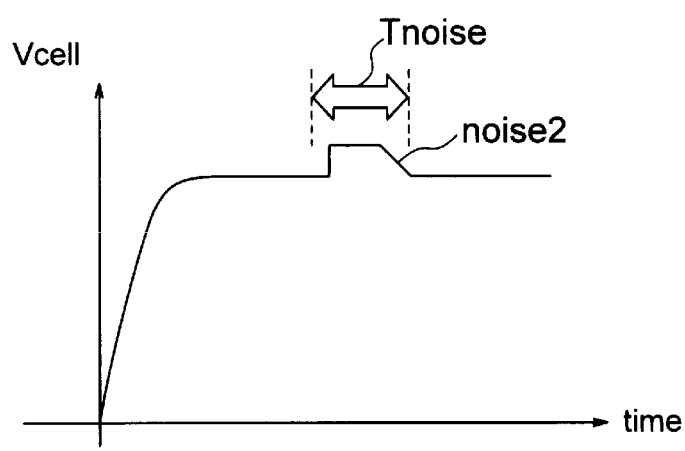

If the capacitive element CAP of FIG. 3 is not provided, then the noise 2 is transmitted to the selected bit line BL_sel, but the noise 3 is not transmitted to the selected word line WL_sel. FIG. 4B is a graph illustrating a relationship between the cell voltage Vcell and time of the memory chip without the capacitive element CAP being incorporated. Since the noise 3 is not transmitted to the selected word line WL_sel, the voltage on only the selected bit line BL_sel increases due to the noise 2 while the voltage of the selected word line WL_sel remains unchanged at the selected word line voltage VLOW. Thus, as illustrated in FIG. 4B, the noise 2 is not offset and is directly applied in the cell voltage Vcell. The sense amplifier SA cannot accurately read data during a noise period Tnoise during which the noise 2 is applied. Thus, during the noise period Tnoise, the sense amplifier SA needs to wait. For example, the noise period Tnoise is several 100 ns to 2 μs. A sense period in which the sense amplifier SA detects data is 300 ns to 400 ns. As such, the noise period Tnoise is a period comparable to or even longer than the normal sense period. Thus, if the capacitive element CAP is not provided, data detection time is lengthened.

In contrast to this, according to the present embodiment, the capacitive element CAP transmits approximately the same noise to the selected bit line BL_sel and the selected word line WL_sel almost simultaneously, and thus the noise 2 and the noise 3 offset in the selected memory cell MC_sel. Thereby, even if a noise 1 enters via the non-selected bit line BL_unsel, the sense amplifier SA can still accurately detect data of the selected memory cell MC_sel and shorten the data detection time.

It is preferable that voltages of the noise 2 and the noise 3 are equal to each other, but the voltages may also be different to some extent. That is, even if Equation 1 is not precisely established, the effect of the noise 2 may be reduced to some extent by the offsetting effect of the noise 3. Thus, even in such a case, the sense amplifier SA can accurately detect data of the selected memory cell MC_sel and shorten the data detection time.

Modification Example

The capacitive element CAP may be supplied by a parasitic capacitance established between the first node N1 and the second node N2. In such a case, a wire to the node N1 (e.g., a wire between the non-selected BL voltage generation circuit GEN_BL_unsel and the multiplexer MUX_BL0) and a wire to the second node N2 (e.g., a wire between the selected WL voltage generation circuit GEN_WL_sel and the multiplexer MUX_WL0) may be provided so as to extend substantially in parallel over some predetermined distance at some a predetermined interval (spacing distance between the wires). The predetermined interval and the predetermined distance will differ depending on a material of an interlayer insulating film in which the wires are disposed, a material of the wire of the first node N1, a material of the wire of the second node N2, a required size of the capacitance Ccap, and the like, and thus, the predetermined interval and the predetermined distance cannot be precisely specified without knowledge of additional parameter values. However, assuming knowledge of these additional parameter values, the predetermined interval and the predetermined distance can be calculated.

Since the capacitive element CAP in this modification is a parasitic capacitance between wirings of the first node N1 and the second node N2, a dedicated, physical disposition area for the capacitive element CAP may be omitted from the device at least so far as the parasitic capacitance can be provided in non-dedicated region of the device. Thus, the memory chip 1 can be miniaturized.

Second Embodiment

Figure 5:
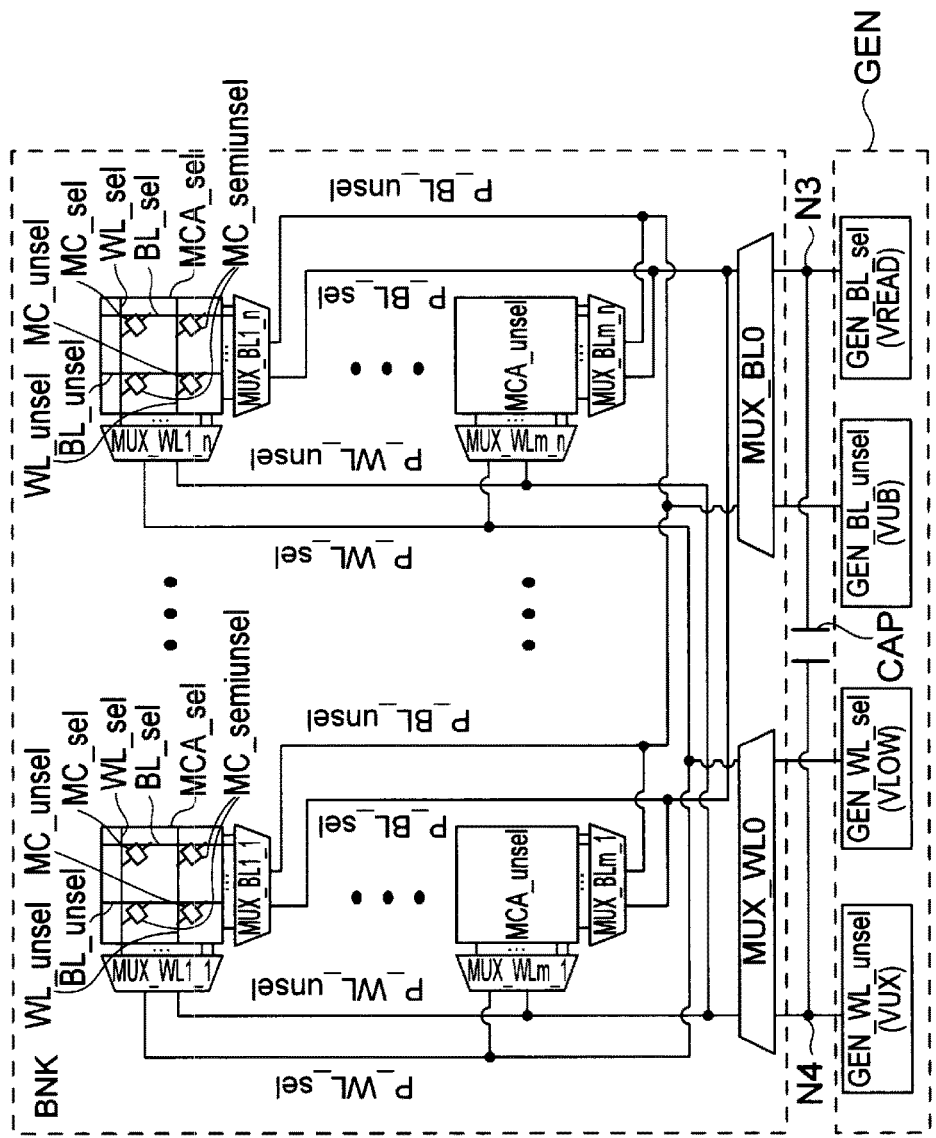
FIG. 5 is a block diagram illustrating aspects of a bank, a column decoder and a row decoder according to a second embodiment.

FIG. 5 is a block diagram illustrating a more detailed configuration example of the bank BNK, the column decoder CD, and the row decoder RD according to the second embodiment.

In the first embodiment, the capacitive element CAP is connected between the first node N1 and the second node N2. However, in the second embodiment, the capacitive element CAP is connected between a third node N3 and a fourth node N4. The third node N3 is a connection between the selected BL voltage generation circuit GEN_BL_sel as the first power supply circuit and the multiplexer MUX_BL0 as the first decoder, and may be at any location along the connection. The fourth node N4 is a connection between the non-selected WL voltage generation circuit GEN_WL_unsel as the fourth power supply circuit and the multiplexer MUX_WL0 as the second decoder, and may be at any location along the connection. The other configurations of the second embodiment may be considered to be the same as the corresponding configuration of the first embodiment unless otherwise specified. In addition, a data read operation according to the second embodiment may be substantially the same as the data read operation according to the first embodiment.

Thereby, even if a parasitic capacitance between adjacent word lines WL is large, when noise enters the non-selected word line WL_unsel that is adjacent to the selected word line WL_sel, the noise is transmitted to the selected word line WL_sel and selected bit line BL_sel almost simultaneously. As a result, noise is offset in the selected memory cell MC_sel. That is, in the second embodiment, even if noise enters the non-selected word line WL_unsel, the sense amplifier SA can still accurately detect data of the selected memory cell MC_sel and the data detection time can be shortened.

The capacitance of the capacitive element CAP is referred to as Ccap, and the capacitance of the selected bit line BL_sel is referred to as CBL_sel. The capacitance of the selected word line WL_sel and the non-selected word line WL_unsel adjacent thereto is referred to as CWL_sel_unsel, and the capacitance of the selected word line WL_sel is referred to as CWL_sel. In this case, a ratio (Ccap/CBL_sel) of the capacitance Ccap to the capacitance CBL_sel is approximately equal to the ratio (CWL_sel_unsel/CWL_sel) of the capacitance CWL_sel_unsel to the capacitance CWL_sel. That is:

Ccap/CBL_sel=CWL_sel_unsel/CWL_sel          (Equation 2)

The capacitance Ccap is set so as to satisfy Equation 2. Thereby, even if noise enters the non-selected word line WL_unsel, approximately equal noise is transmitted to the selected bit line BL_sel and the selected word line WL_sel. Thus, noises having an approximately equal magnitude are almost simultaneously applied to the selected bit line BL_sel and the selected word line WL_sel. Thus, in the second embodiment, the same effects as in the first embodiment can be obtained.

Figure 6:
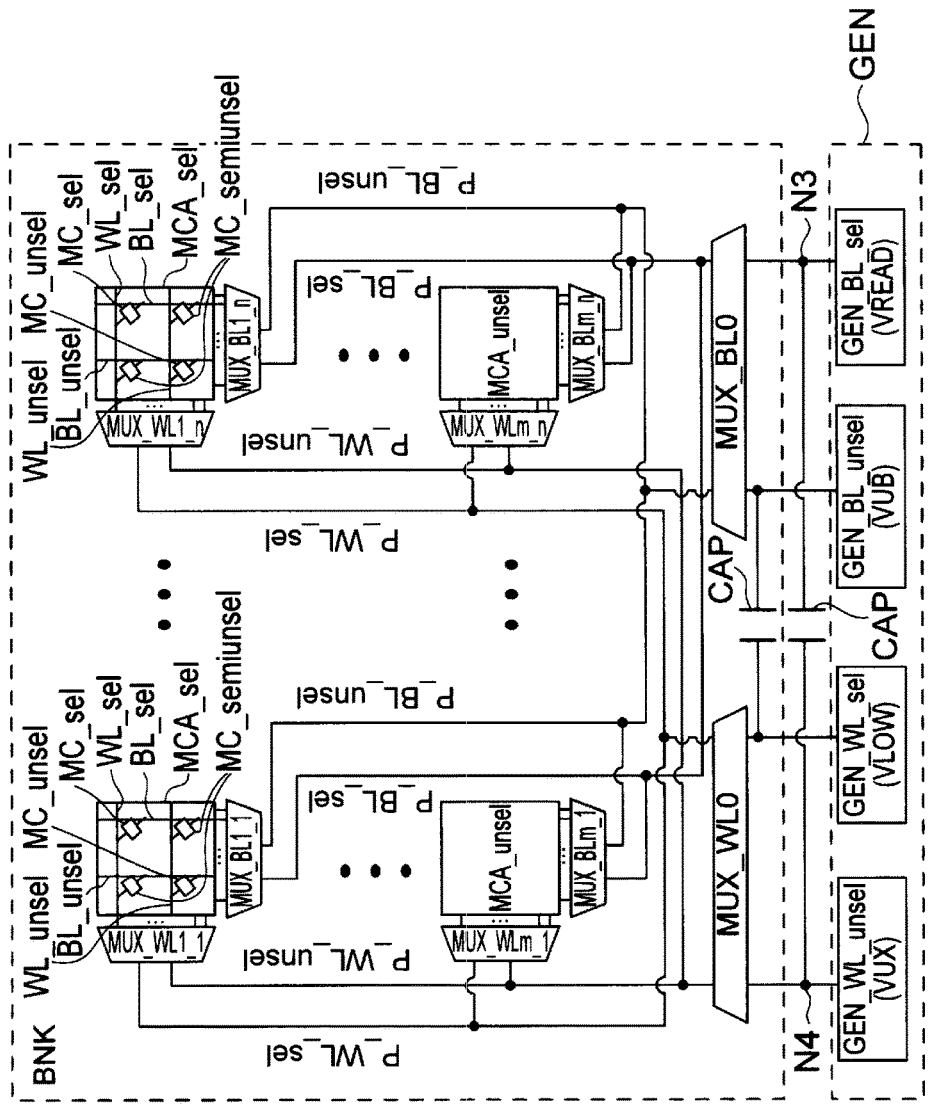
FIG. 6 is a diagram illustrating an embodiment in which the first embodiment and the second embodiment are combined.

Furthermore, the first embodiment and the second embodiment may be combined. That is, a capacitive element CAP may be provided between the node N1 and the node N2, and between the node N3 and the node N4. FIG. 6 is a diagram illustrating an embodiment in which the first embodiment and the second embodiment are combined. Thereby, even if noise enters both the non-selected bit line BL_unsel and the non-selected word line WL_unsel, the noises can be offset or counteracted. That is, the embodiment illustrated in FIG. 6 can obtain the effects of both the first embodiment and the second embodiment.

Third Embodiment

Figure 7:
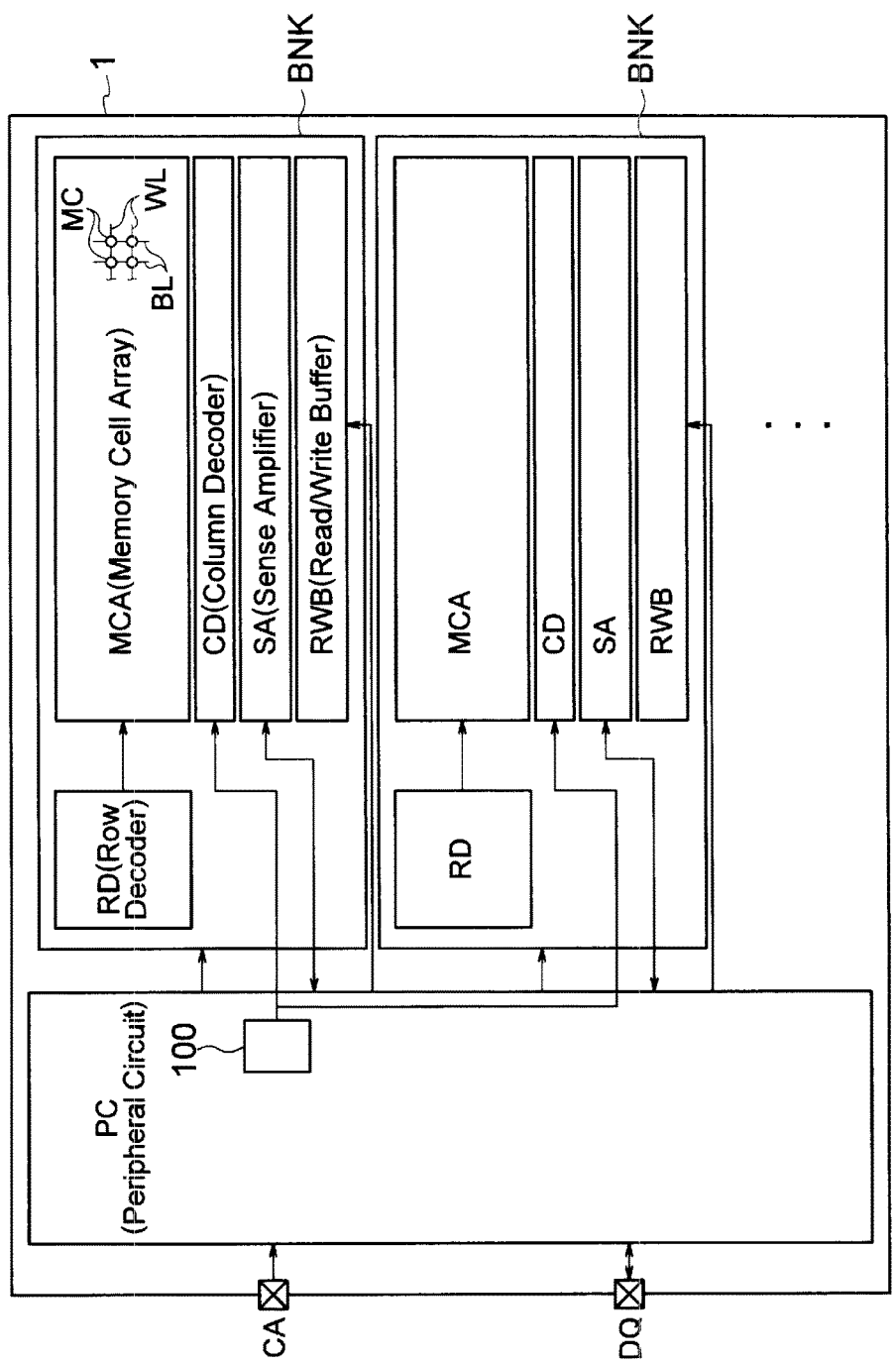
FIG. 7 is a block diagram illustrating aspects of a memory chip according to a third embodiment.

FIG. 7 is a block diagram illustrating a configuration example of a memory chip according to a third embodiment. The memory chip 1 further includes a noise generation unit 100 that is connected to the non-selected BL voltage generation circuit GEN_BL_unsel as a second power supply and applies a noise voltage to the non-selected bit line BL_unsel. Other configurations according to the third embodiment may be considered the same as corresponding configurations according to the first embodiment unless otherwise specified.

A testing is performed when a fabrication process of a semiconductor wafer is completed, and the noise generation unit 100 is used during the test. In the test, the noise generation unit 100 applies noise to the non-selected bit line BL_unsel or the non-selected word line WL_unsel.

For example, if the capacitive element CAP is being provided between the first node N1 and the second node N2 as in the first embodiment, the noise generation unit 100 applies noise to the non-selected bit line BL_unsel during the test of a data read operation. At this time, the capacitive element CAP can be trimmed such that data detection time of the sense amplifier SA becomes as short as possible. Thereby, the size of the capacitive element CAP can be optimized.

In addition, for example, if the capacitive element CAP is being provided between the third node N3 and the fourth node N4 as in the second embodiment, the noise generation unit 100 applies noise to the non-selected word line WL_unsel during the test of the data read operation. At this time, the capacitive element CAP can be trimmed such that the data detection time of the sense amplifier SA becomes as short as possible. Thereby, the size of the capacitive element CAP can be optimized.

Thereafter, the semiconductor wafer is diced and divided into memory chips 1. The memory chip 1 is stacked on amounting substrate to be packaged. Thereby, a semiconductor memory device is manufactured.

According to the third embodiment, the capacitance Ccap of the capacitive element CAP can be substantially optimized while still on an undiced semiconductor wafer, that is, prior to packaging of the final device. In addition, in the third embodiment, the effects of the first embodiment or the second embodiment can also be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device, comprising:
a memory cell array;
a plurality of bit lines connected to the memory cell array;
a plurality of word lines connected to the memory cell array;
a first power supply circuit that generates a selected bit line voltage that is applied to a selected bit line among the plurality of bit lines;
a second power supply circuit that generates a non-selected bit line voltage that is applied to non-selected bit lines among the plurality of bit lines;
a third power supply circuit that generates a selected word line voltage that is applied to a selected word line from among the plurality of word lines;
a fourth power supply circuit that generates a non-selected word line voltage that is applied to non-selected word lines from among the plurality of word lines;
a first decoder that connects the selected bit line to the first power supply circuit and connects the non-selected bit line to the second power supply circuit;

a second decoder that connects the selected word line to the third power supply circuit and connects the non-selected word line to the fourth power supply circuit; and a first capacitive element between a first node that is between the second power supply circuit and the first decoder and a second node that is between the third power supply circuit and the second decoder.

2. The semiconductor memory device according to claim 1, wherein the first capacitive element is a capacitor.

3. The semiconductor memory device according to claim 1, wherein the first capacitive element is formed as a parasitic wiring capacitance between wiring paths for the non-selected bit lines and the selected word lines.

4. The semiconductor memory device according to claim 1, wherein the first capacitive element is a metal-oxide-semiconductor (MOS) capacitor, a polysilicon capacitor, or a metal capacitor.

5. The semiconductor memory device according to claim 1, wherein the ratio between a capacitance of the first capacitive element and a capacitance of the selected word line is approximately equal to the ratio between a parasitic capacitance between the selected bit line and the non-selected bit line adjacent to the selected bit line and a capacitance of the selected bit line.

6. The semiconductor memory device according to claim 1, wherein a noise voltage that is transmitted on the non-selected bit line is approximately equal to a voltage of the selected bit line and the selected word line.

7. The semiconductor memory device according to claim 6, further comprising:
a noise generation source that is connected to the second power supply circuit and applies the noise voltage to the non-selected bit line.

8. The semiconductor memory device according to claim 1, wherein
the first node is between the second power supply circuit and a bit line multiplexer in a memory bank of the memory cell array, and
the second node is between the third power supply circuit and a word line multiplexer in the memory bank of the memory cell array.

9. The semiconductor memory device according to claim 1, further comprising:
a second capacitive element between a third node that is between the first power supply circuit and the first decoder and a fourth node that is between the fourth power supply circuit and the second decoder.

10. The semiconductor memory device according to claim 9, wherein the ratio between a capacitance of the second capacitive element and a capacitance of the selected bit line is approximately equal to the ratio between a capacitance of the unselected word line and a capacitance of the selected word line.

11. A semiconductor memory device, comprising:
a memory cell array;
a plurality of bit lines connected to the memory cell array;
a plurality of word lines connected to the memory cell array;
a first power supply circuit that generates a selected bit line voltage that is applied to a selected bit line among the plurality of bit lines;
a second power supply circuit that generates a non-selected bit line voltage that is applied to non-selected bit lines among the plurality of bit lines;

a third power supply circuit that generates a selected word line voltage that is applied to a selected word line from among the plurality of word lines;
a fourth power supply circuit that generates a non-selected word line voltage that is applied to non-selected word lines from among the plurality of word lines;
a first decoder that connects the selected bit line to the first power supply circuit and connects the non-selected bit line to the second power supply circuit;
a second decoder that connects the selected word line to the third power supply circuit and connects the non-selected word line to the fourth power supply circuit; and
a first capacitive element provided at one of:
between a first node that is between the second power supply circuit and the first decoder and a second node that is between the third power supply circuit and the second decoder, and
between a third node that is between the first power supply circuit and the first decoder and a fourth node that is between the fourth power supply circuit and the second decoder.

12. The semiconductor memory device according to claim 11, wherein the first capacitive element is a capacitor.

13. The semiconductor memory device according to claim 11, wherein the first capacitive element is formed as a parasitic wiring capacitance between wiring paths for the non-selected word lines and the selected bit lines.

14. The semiconductor memory device according to claim 11, wherein the ratio between a capacitance of the first capacitive element and a capacitance the selected bit line is approximately equal to the ratio between a capacitance of the unselected word line and a capacitance of the selected word line.

15. The semiconductor memory device according to claim 11, wherein
the first capacitive element is between the first node and the second node, and
the semiconductor memory device further comprises:
a second capacitive element between the third node and the fourth node.

16. The semiconductor memory device according to claim 15, wherein the ratio between a capacitance of the first capacitive element and a capacitance of the selected word line is approximately equal to the ratio between a parasitic capacitance between the selected bit line and the non-selected.

17. A semiconductor memory device, comprising:
a memory bank including:
a memory cell array having a plurality of word lines and a plurality of bit lines connected thereto;
a row decoder connected to the plurality of word lines; and
a column decoder connected to the plurality of bit lines;
a peripheral circuit including:
a first power supply circuit that generates a selected bit line voltage that is applied to a selected bit line among the plurality of bit lines;
a second power supply circuit that generates a non-selected bit line voltage that is applied to non-selected bit lines among the plurality of bit lines;
a third power supply circuit that generates a selected word line voltage that is applied to a selected word line from among the plurality of word lines; and a fourth power supply circuit that generates a non-selected word line voltage that is applied to non-selected word lines from among the plurality of word lines; and a first capacitive element between a first node that is between the second power supply circuit and the column decoder and a second node that is between the third power supply circuit and the row decoder, wherein the ratio between a capacitance of the first capacitive element and a capacitance of the selected word line is approximately equal to the ratio between a parasitic capacitance between the selected bit line and the non-selected bit line adjacent to the selected bit line and a capacitance of the selected bit line.

18. The semiconductor memory device according to claim 17, further comprising:

a second capacitive element between a third node that is between the first power supply circuit and the column decoder and a fourth node that is between the fourth power supply circuit and the row decoder, wherein the ratio between a capacitance of the second capacitive element and a capacitance the selected bit line is approximately equal to the ratio between a capacitance of the unselected word line and a capacitance of the selected word line.

19. The semiconductor memory device according to claim 18, wherein at least one of the first and second capacitive elements is a parasitic capacitance.

20. The semiconductor memory device according to claim 18, wherein at least one of the first and second capacitive elements is a capacitor.

* * * * *